United States Patent [19]

Ushio et al.

[11] Patent Number: 4,804,559
[45] Date of Patent: Feb. 14, 1989

[54] ELECTROLESS GOLD PLATING SOLUTION

[75] Inventors: Jiro Ushio, Yokohama; Osamu Miyazawa, Yokosuka; Hitoshi Yokono, Fujisawa; Akira Tomizawa, Yokohama, all of Japan

[73] Assignee: Hitachi, Ltd., Tokyo, Japan

[21] Appl. No.: 91,457

[22] Filed: Aug. 31, 1987

Related U.S. Application Data

[62] Division of Ser. No. 918,498, Oct. 14, 1986, abandoned.

[30] Foreign Application Priority Data

Oct. 14, 1985 [JP] Japan .................................. 60-226738
Apr. 18, 1986 [JP] Japan .................................. 61-88269

[51] Int. Cl.⁴ .................................................. C23C 3/02
[52] U.S. Cl. .......................................... 427/96; 427/98; 427/125; 427/443.1; 106/1.05; 106/1.26
[58] Field of Search ................ 427/96, 98, 125, 443.1; 106/1.05, 1.26

[56] References Cited

U.S. PATENT DOCUMENTS 3,300,328  1/1967  Luce .................................. 106/1.26
3,697,296 10/1972  Bellis ................................ 106/1.26

FOREIGN PATENT DOCUMENTS 2803147  7/1979  Fed. Rep. of Germany ..... 106/1.23
0150762  9/1981  German Democratic Rep. ..................................... 427/306
1203131  8/1970  United Kingdom ............... 106/1.23

Primary Examiner—Sam Silverberg
Attorney, Agent, or Firm—Antonelli, Terry & Wands

[57] ABSTRACT

An electroless gold plating solution comprising a thiosulfato gold(I) complex, a thiosulfate, thiourea, a pH regulator and a stabilizer. The electroless gold plating solution shows a plating rate and a plating solution stability comparable to those of conventional gold plating solutions containing cyanide ions, and requires a smaller amount of reducing agent to be used therein. Further, the electroless gold plating solution is safe because it does not contain cyanide ions.

13 Claims, 1 Drawing Sheet

ELECTROLESS GOLD PLATING SOLUTION

This application is a divisional application of application Ser. No. 918,498, filed Oct. 14, 1986 now abandoned.

BACKGROUND OF THE INVENTION

The present invention relates to an electroless gold plating solution, and more particularly, to a gold plating solution low in toxicity and stable for a long time.

Hitherto, an electroless gold plating solution has been known which contains gold(I) potassium cyanide, potassium cyanide and borane compound as main constituents, as disclosed in *Plating*, 57 (1970), pp. 914–920. By using the plating solution, a plating rate of 1 $\mu$m/hr and stability of the solution are ensured. However, since the plating solution contains a large amount of cyanide ions, there is a safety problem in operation with the solution and in disposal of a waste liquid.

As electroless gold plating solution not containing cyanide ions, a gold plating solution containing gold(III) chloride and hydrazine as main constituents is disclosed in U.S. Pat. No. 3,300,328, and a gold plating solution containing gold(III) potassium chloride and a borane compound is disclosed in Japanese Patent Publication No. 56-20353 (1981). However, since both of the electroless gold plating solutions disclosed respectively in U.S. Pat. No. 3,300,328 and Japanese Patent Publication No. 56-20353 (1981) contain gold ions in the gold complex in the state of trivalent gold ions, the use of the solutions requires a larger amount of reducing agent, as compared to the case of using gold(I) potassium cyanide. In addition, the electroless gold plating solution disclosed in U.S. Pat. No. 3,300,328 is so unstable that precipitation occurs in the plating solution in about 2 hours, making it impossible to continue plating.

SUMMARY OF THE INVENTION

An object of the present invention is to provide an electroless gold plating solution which does not contain cyanide ions as a plating liquid constituent, requires a smaller amount of reducing agent, and has a plating rate and a plating solution stability comparable to those of conventional gold plating solutions containing cyanide ions.

The above-mentioned object can be attained by providing an electroless gold plating solution which comprises water, a thiosulfato gold(I) complex as a gold complex, a thiosulfate as a complexing agent, thiourea as a reducing agent, a pH regulator and a stabilizer.

The above-mentioned composition of the electroless gold plating solution has been determined on the following grounds.

In the first place, the purpose of the use of a large amount of cyanide ions in a conventional electroless gold plating solution is to prevent, by the ability of cyanide ions to form stable gold complex ions, the precipitation of gold through decomposition of gold complex ions formed from a gold complex, in the case where a plating solution is made to be alkaline and a strong reducing agent is used.

However, the present inventors considered that the use of cyanide ions is not necessary under the condition where the plating solution is made to be neutral and the reducing power of a reducing agent is weakened. In such a case, however, for obtaining a satisfactory gold film quality it is necessary to maintain gold complex ions in a stable state, and the present inventors presumed that thiosulfate ions are suitable for use as a complexing agent in place of cyanide ions. Based on the presumption, an electroless gold plating solution was prepared by selecting thiourea as a reducing agent having a strong reducing power in a neutral aqueous solution, using a thiosulfato gold(I) complex, e.g., gold(I) sodium thiosulfate as a gold complex, using a thiosulfate, e.g., sodium thiosulfate as a complexing agent and adding a stabilizer, and the characteristics of the thus prepared solution were evaluated. As a result, it was found that the thus prepared plating solution shows a plating rate and a plating solution stability comparable to those of conventional plating solutions containing cyanide ions, and gives satisfactory gold films. It was also found that when a mixture of a chloroaurate(III), e.g., sodium tetrachloroaurate(III) and a thiosulfate, e.g., sodium thiosulfate is used as a gold complex, the trivalent gold ions are reduced to univalent gold ions, producing the same effect as that in the case of using a thiosulfato gold(I) complex. Based on the findings, the electroless gold plating solution of the present invention has been obtained.

The electroless gold plating solution according to the present invention will now be described more in detail as follows.

The thiosulfato gold(I) complex is a complex comprising a gold atom as a center atom and comprising at least one thiosulfate ion in one molecule thereof. An example of the thiosulfato gold(I) complex is a dithiosulfatoaurate(I), which has a chemical formula of $M_3[Au(S_2O_3)_2]$, wherein M represents a metal such as Na and K, preferably, an alkali metal, particularly, Na. In addition, the complex is formed in an aqueous solution containing a halogenoauroate and a thiosulfate in mixture, so that such a mixture may be used as a gold source. The halogenoaurate is, for example, a tetrachloroaurate. The molecular formula of the halogenoaurate is $MAuX_4$, wherein M represents a metal such as Na and K, preferably, an alkali metal, particularly, Na, and X represents a halogen atom such as F, Cl, Br and I. The thiosulfate is, for example, one represented by the formula $M_2S_2O_3$, wherein M represents a metal such as Na and K, preferably, an alkali metal.

In addition to the gold source mentioned above, the electroless gold plating solution of the present invention further comprises a reducing agent, a complexing agent, a pH regulator and a stabilizer. The reducing agent is a compound showing a reducing action on the surface of gold, for instance, thiourea. The complexing agent is a compound capable of being bonded to gold ion to form a complex, for instance, the above-mentioned thiosulfate. The stabilizer is used for preventing decomposition of the complexing agent; for example, where a thiosulfate is used as the complexing agent, the stabilizer is a sulfite, for example, one represented by the chemical formula $M_2SO_3$, where M represents a metal such as Na and K, preferably, an alkali metal, particularly, Na. The pH regulator is an additive for setting the initial pH value of the plating solution to a desired value and is, for instance, hydrochloric acid or sodium hydroxide. Further, compounds preferably having a pH buffer effect may be added as a pH regulator. For instance, ammonium chloride or borax ($Na_2B_4O_7$) may be added, borax being preferred.

Thus, as to the constituents of the electroless gold plating solution of the present invention, concrete compounds and chemical formulas thereof have been mentioned.

The following descriptions (a) to (f) cover the limitations on the amounts of the constituents of the electroless gold plating solution according to the present invention, and the grounds for the limitations.

(a) The content of the thiosulfato gold(I) complex is suitably from 0.001 to 0.2 mol/l, preferably, from 0.006 to 0.04 mol/l, particularly, from 0.001 to 0.03 mol/l. If the content of the complex is less than 0.001 mol/l, the plating reaction scarcely proceeds, whereas if the content is more than 0.2 mol/l, precipitation of gold occurs in the plating solution.

(b) Where a mixture of a halogenoaurate(III) and a thiosulfate is used as a gold source, the content of the halogenoaurate(III) is suitably from 0.001 to 0.2 mol/l, preferably, from 0.006 to 0.05 mol/l, particularly, from 0.001 to 0.003 mol/l. If the content of the halogenoaurate(III) is less than 0.001 mol/l, the plating reaction scarcely proceeds, whereas if the content is more than 0.2 mol/l, precipitation of gold occurs in the plating solution. The content of the thiosulfate is suitably from 0.002 to 0.4 mol/l, preferably, from 0.02 to 0.12 mol/l, particularly, from 0.03 to 0.08 mol/l. If the content of the thiosulfate is less than 0.002 mol/l, gold is liable to be precipitated from the solution, whereas if the content is more than 0.4 mol/l, precipitation of sulfur occurs.

(c) The content of thiourea is suitably from 0.001 to 1.0 mol/l, preferably, from 0.01 to 0.5 mol/l, particularly, from 0.02 to 0.3 mol/l. If the content of thiourea is less than 0.001 mol/l, the plating reaction scarcely proceeds, whereas an addition of more than 1.0 mol/l of thiourea does not produce any special effect on the plating reaction.

(d) The content of the thiosulfate as a complexing agent is suitably from 0.001 to 0.5 mol/l, preferably, from 0.001 to 0.4 mol/l, particularly, from 0.05 to 0.1 mol/l. If the content of the thiosulfate is less than 0.001 mol/l, gold is liable to be precipitated in the plating solution, whereas if the content is more than 0.5 mol/l, sulfur is precipitated.

(e) The content of sodium sulfite is suitably from 0.01 to 0.8 mol/l, preferably, from 0.08 to 0.7 mol/l, particularly, from 0.15 to 0.6 mol/l. If the content of sodium sulfite is less than 0.01 mole/l, sulfur is liable to be precipitated in the plating solution, whereas if the content is more than 0.8 mol/l, the plating reaction scarcely proceeds.

(f) The content of ammonium chloride or borax is suitably from 0.09 to 1.0 mol/l, preferably, from 0.4 to 1.0 mol/l, particularly, from 0.4 to 0.8 mol/l. If the content of ammonium chloride or borax is less than 0.09 mol/l, the plating reaction is greatly decelerated or stopped soon after the start of the reaction, whereas an addition of more than 1.0 mol/l ammonium chloride or borax does not produce any special effect on the plating reaction.

The pH value of the plating solution is suitably from 3.0 to 11.0, preferably, from 4.0 to 10.0, particularly, from 5.0 to 9.0. The solution temperature is from 60° to 90° C., preferably, from 65° to 85° C., particularly, from 70° to 80° C.

DETAILED DESCRIPTION OF THE PREFERRED EMBODIMENTS

The present invention will be described more in detail referring to the following examples.

EXAMPLE 1

On a copper plate 2.5 cm×2.5 cm in size and 0.3 mm in thickness, a nickel film 2 $\mu$m thick and a gold film 1 $\mu$m thick were subsequently deposited by electroplating to obtain a specimen. The specimen was washed with a degreasing liquid and then with dilute hydrochloric acid, and washed well with water. After drying the specimen in a nitrogen stream, the weight of the specimen was measured. The specimen was then immersed for 2 hours in a plating solution having the following composition, with a solution temperature of 60° C. and pH adjusted to 4.0 by use of hydrochloric acid.

| Composition of plating solution: | |
|---|---|
| Gold(I) sodium thiosulfate | 10.0 g/l |
| Sodium thiosulfate | 50.0 g/l |
| Sodium sulfite | 25.0 g/l |
| Ammonium chloride | 10.0 g/l |
| Thiourea | 15.0 g/l |

Figure 1:
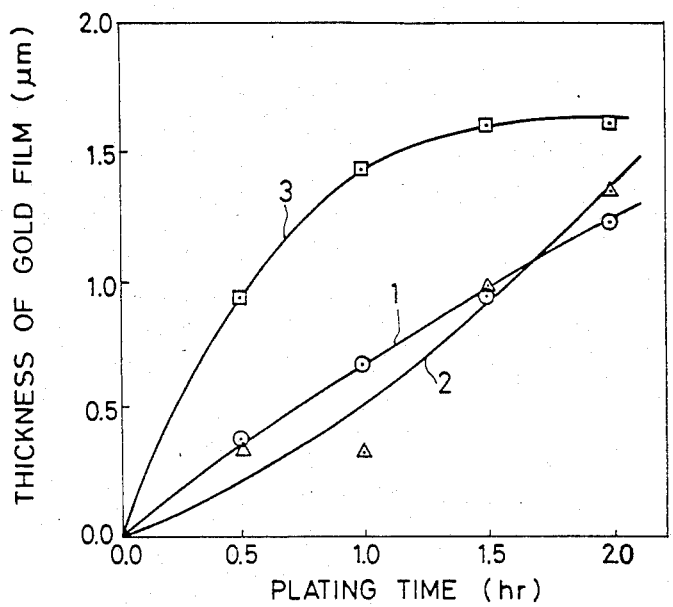
FIG. 1 shows a diagram of the relationship between the thickness ($\mu$m) of gold film and plating time (hr) in the case where a gold film is deposited by using an electroless gold plating solution according to the present invention.

During the plating, the plating solution was forcibly stirred, and the specimen was taken out at an interval of 30 min for the measurement of gold film thickness by a weight method. The results are shown as curve 1 in the diagram of FIG. 1.

The thickness of the gold film reached 1.2 $\mu$m after 2 hr from the start of plating. The gold film thus deposited was dull and bright yellow in color, and no precipitation was observed in the plating solution.

EXAMPLE 2

Specimens prepared in the same manner as in Example 1 were immersed for 2 hours in a plating solution having the following composition, with a solution temperature of 80° C. and pH adjusted to 5.0 by use of hydrochloric acid.

| Composition of plating solution: | |
|---|---|
| Sodium tetrachloroaurate(III) | 10.0 g/l |
| Sodium thiosulfate | 60.0 g/l |
| Sodium sulfite | 25.0 g/l |
| Ammonium chloride | 10.0 g/l |
| Thiourea | 8.0 g/l |

During the plating, the plating solution was forcibly stirred, and measurement of gold film thickness was carried out in the same manner as in Example 1. The results are shown as curve 2 in the diagram of FIG. 1. The thickness of the gold film reaches 1.8 $\mu$m after 2 hr from the start of plating. The gold film thus deposited was dull and bright yellow in color, and no precipitation was observed in the solution.

EXAMPLE 3

Specimens prepared in the same manner as in Example 1 were immersed for 2 hours in a plating solution having the following composition, with a solution temperature of 80° C. and pH adjusted to 5.0 by use of hydrochloric acid.

| Composition of plating solution: | |
|---|---|
| Sodium tetrachloroaurate(III) | 10.0 g/l |
| Sodium thiosulfate | 60.0 g/l |
| Sodium sulfite | 12.0 g/l |
| Ammonium chloride | 40.0 g/l |
| Thiourea | 8.0 g/l |

During the plating, the plating solution was forcibly stirred, and measurement of gold film thickness was carried out in the same manner as in Example 1. The results are shown as curve 3 in the diagram of FIG. 1. The thickness of the gold film reached 1.7 μm after 2 hr from the start of plating. The gold film thus deposited was dull and bright yellow in color, and no precipitation was observed in the solution.

As described hereinabove, according to the present invention it is possible to perform continuous gold plating to give a thick gold film while using a plating solution not containing cyanide ions. Accordingly, the present invention is effective in ensuring safety in electroless gold plating operation and in facilitating disposal of a waste liquid. Particularly, when the present invention is applied to a gold plating process for electronic parts such as ceramic substrates, the plating process can be greatly rationalized.

EXAMPLE 4

This example illustrates an execution of gold plating on electronic parts by use of an electroless gold plating solution according to the present invention.

Figure 2:
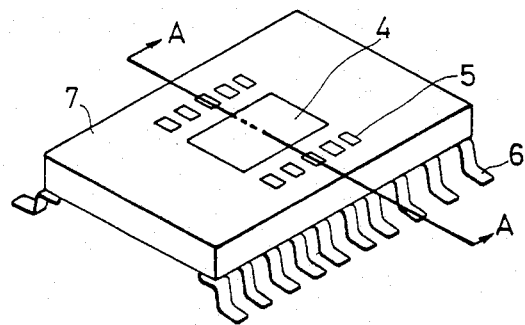
FIG. 2 shows a prespective view of an electronic part plated with gold by use of an electroless gold plating solution according to the present invention.
Figure 3:
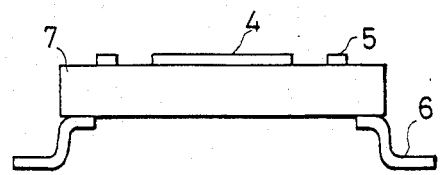
FIG. 3 shows a cross-sectional view of the electronic part along line A—A in FIG. 2.

FIG. 2 shows an alumina ceramic substrate 7 used in this example, and FIG. 3 shows a cross-sectional view of the substrate. On the surface of each conductor of tungsten-made die bonding pads 4, tungsten-made wire bonding pads 5 and Kovar ®-made leads 6, a nickel film was deposited in a thickness of 3 μm and then a gold film also 3 μm thick was deposited thereon by displacement gold plating. The substrate was washed with a degreasing liquid and then with dilute hydrochloric acid, washed well with water, and dried in a nitrogen stream. The substrate was then immersed for 3 hours in the electroless gold plating solution according to the present invention having the composition as shown in Example 3. In the plating, the solution temperature was 60° C., pH was 4.0 and the solution was forcibly stirred. The thickness of the gold film thus deposited was measured by a fluorescent X-ray thickness measuring instrument to be 1.8 μm.

Twenty ceramic substrates thus obtained as specimens were subjected to evaluation of connection characteristics of the gold-plated parts following the procedures described bellow.

(1) Die Bonding Properties

The die bonding pad and a silicon chip were die bonded to each other in a nitrogen atmosphere at 430° C. The thus die-bonded specimens were subjected to a thermal shock test (5 cycles of 0° C., 10 sec each), and the specimens free of separation of the silicon chip were evaluated as acceptable.

(2) Wire Bonding Properties

A gold wire 25 μm in diameter was pressure welded to the wire bonding pad of each specimen heated to about 150° C., and the wire was pulled under a load of 6 g. The specimens free of separation of the wire were evaluated as acceptable.

(3) Solderability

The leads of the specimens heated at 460° C. for 15 min in air was subjected to dip soldering, and the specimens in which not less than 95% of the lead area was wetted with the solder were evaluated as acceptable.

As a result of the evaluations, all of the 20 specimens were evaluated as acceptable.

EXAMPLE 5

Terminal parts (made of copper) and connecting plug parts of a printed wiring board were plated with gold by use of an electroless gold plating solution of the present invention in the same manner as in Example 4, and satisfactory results similar to those in Example 4 were obtained.

Namely, when conductors plated with nickel were subjected to electroless gold plating in the same manner as in Example 4, satisfactory results similar to those in Example 4 were obtained.

What is claimed is:

1. A process for electroless gold plating a workpiece, comprising the steps of:
    contacting said workpiece with an electroless gold plating solution, the electroless gold plating solution comprising water, a thiosulfato gold (I) complex in an amount of 0.001 to 0.2 mol/l, a thiosulfate in an amount of 0.001 to 0.5 mol/l, thiourea, a pH regulator and a stabilizer; and
    depositing gold from said electroless gold plating solution on said workpiece by electroless deposition.

2. A process according to claim 1, wherein said workpiece includes a metallic surface, and the gold is deposited on said metallic surface.

3. A process according to claim 2, wherein said contacting is performed by immersing said metallic surface in said electroless gold plating solution.

4. A process according to claim 3, wherein said metallic surface is a gold surface.

5. A process according to claim 4, wherein said gold surface is gold formed by displacement plating.

6. A process according to claim 4, wherein said gold surface is gold formed by electroplating.

7. A process according to claim 1, wherein said solution is at a temperature of 60°–90° C. during said contacting.

8. An electroless gold plating process, comprising the steps of:
    forming a first conductor material on a substrate;
    forming a second conductor made from nickel on said first conductor material;
    forming a gold film, by displacement gold plating, on said second conductor; and
    forming a further gold film by electroless gold plating on said gold film, said electroless gold plating being performed by contacting said gold film with an electroless gold plating solution comprising water, a thiosulfato gold (I) complex in an amount of 0.001 to 0.2 mol/l, a thiosulfate in an amount of 0.001 to 0.5 mol/l, thiourea, a pH regulator and a stabilizer, and electrolessly depositing said further gold film from said electroless gold plating solution.

9. A process according to claim 8, wherein said substrate is made of a ceramic material.

10. A process according to claim 8, wherein said first conductor material forms a bonding pad.

11. A process according to claim 8, wherein said first conductor material forms a lead.

12. A process according to claim 9, wherein the substrate is made of an alumina ceramic material.

13. A process according to claim 9, wherein the first conductor material is tungsten.

* * * * *